United States Patent
Goto

(10) Patent No.: US 11,056,388 B2
(45) Date of Patent: Jul. 6, 2021

(54) MASK-INTEGRATED SURFACE PROTECTIVE TAPE

(71) Applicant: FURUKAWA ELECTRIC CO., LTD., Tokyo (JP)

(72) Inventor: Yusuke Goto, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/144,489

(22) Filed: Sep. 27, 2018

(65) Prior Publication Data

US 2019/0109047 A1 Apr. 11, 2019

Related U.S. Application Data

(63) Continuation of application No. PCT/JP2017/012457, filed on Mar. 27, 2017.

(30) Foreign Application Priority Data

Mar. 31, 2016 (JP) .............................. JP2016-073262

(51) Int. Cl.
 *H01L 21/78* (2006.01)
 *H01L 21/304* (2006.01)
 (Continued)

(52) U.S. Cl.
 CPC ............ *H01L 21/78* (2013.01); *B23K 26/361* (2015.10); *H01L 21/02076* (2013.01);
 (Continued)

(58) Field of Classification Search
 None
 See application file for complete search history.

(56) References Cited

U.S. PATENT DOCUMENTS

2002/0055238 A1* 5/2002 Sugino .................... H01L 24/83
 438/459
2005/0218479 A1* 10/2005 Park ....................... H01L 24/32
 257/620
(Continued)

FOREIGN PATENT DOCUMENTS

JP 2005-322853 A 11/2005
JP 2007-19385 A 1/2007
(Continued)

OTHER PUBLICATIONS

Translation of JP 2008063436 (Year: 2008).*
(Continued)

*Primary Examiner* — Xiaoming Liu
(74) *Attorney, Agent, or Firm* — Birch, Stewart, Kolasch & Birch, LLP

(57) ABSTRACT

A surface protective tape, which is used for a method of producing a semiconductor chip including the steps (a) to (d), and contains a substrate film, and a radiation-curable temporary-adhesive layer and a radiation-curable mask material layer provided on the film in this order;
wherein, in the step (b), peeling occurs between the temporary-adhesive layer and the mask material layer before irradiation, and between the mask material layer and the patterned surface described below after irradiation:
 (a) in the state of having laminated the tape on the side of a patterned surface of a semiconductor wafer, grinding the backing-face of the wafer; laminating a wafer fixing tape on the backing-face side of the ground wafer; and supporting and fixing the wafer to a ring flame;
 (b) after integrally peeling both the film and the temporary-adhesive layer from the tape thereby to expose the mask material layer on top, forming an opening by cutting a portion of the mask material layer corresponding to a street of the wafer with a laser;
(Continued)

(c) a plasma-dicing step of segmentalizing the wafer on the street by a $SF_6$ plasma, and thereby for singulating the wafer into semiconductor chips; and
(d) an ashing step of removing the mask material layer by an $O_2$ plasma.

4 Claims, 7 Drawing Sheets

(51) Int. Cl.
H01L 21/3065 (2006.01)
H01L 21/683 (2006.01)
B23K 26/361 (2014.01)
H01L 21/02 (2006.01)

(52) U.S. Cl.
CPC ........ *H01L 21/304* (2013.01); *H01L 21/3065* (2013.01); *H01L 21/6836* (2013.01)

(56) References Cited

U.S. PATENT DOCUMENTS

| | | | |
|---|---|---|---|
| 2008/0242053 A1* | 10/2008 | Lee | H01L 21/3043 438/463 |
| 2009/0004780 A1 | 1/2009 | Arita et al. | |
| 2010/0173474 A1* | 7/2010 | Arita | H01L 21/78 438/462 |
| 2012/0108733 A1* | 5/2012 | Suwa | C09J 7/24 524/555 |
| 2012/0322237 A1* | 12/2012 | Lei | H01L 21/78 438/462 |
| 2014/0038389 A1* | 2/2014 | Kobayashi | H01L 27/14618 438/460 |
| 2019/0107657 A1* | 4/2019 | Jung | C08F 220/18 |

FOREIGN PATENT DOCUMENTS

| | | | |
|---|---|---|---|
| JP | 2008063436 A | * | 3/2008 |
| JP | 2008-98228 A | | 4/2008 |
| JP | 2008-193034 A | | 8/2008 |
| JP | 2009-33155 A | | 2/2009 |
| JP | 2014-523116 A | | 9/2014 |
| JP | 2016-171263 A | | 9/2016 |
| WO | WO 2014/080918 A | | 5/2014 |

OTHER PUBLICATIONS

International Search Report issued in PCT/JP2017/012457 (PCT/ISA/210), dated Jun. 13, 2017.
International Preliminary Report on Patentability, English Translation of Written Opinion of the International Searching Authority dated Oct. 2, 2018, issued in PCT/JP2017/012457 (Forms PCT/IB/373 and PCT/ISA/237).
Extended European Search Report for corresponding European Application No. 17774975.1, dated Feb. 17, 2020.

* cited by examiner

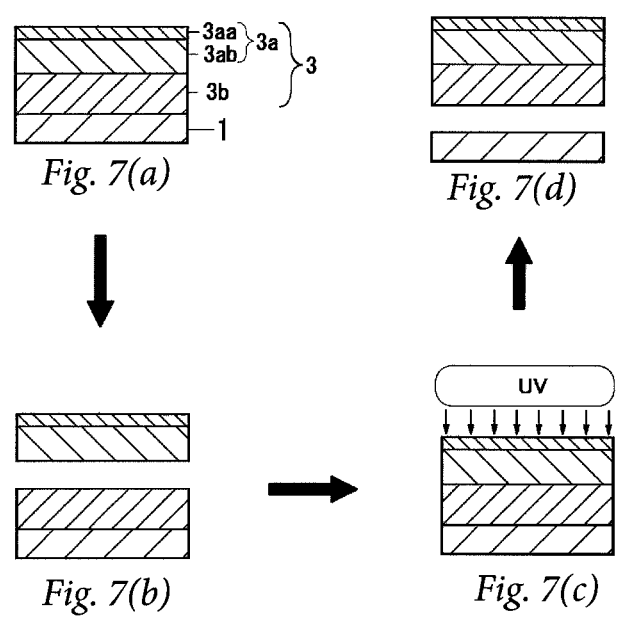

MASK-INTEGRATED SURFACE PROTECTIVE TAPE

CROSS-REFERENCE TO RELATED APPLICATIONS

This application is a Continuation of PCT International Application No. PCT/JP2017/012457 filed on Mar. 27, 2017, which claims priority under 35 U.S.C. § 119 (a) to Japanese Patent Application No. 2016-073262 filed in Japan on Mar. 31, 2016. Each of the above applications is hereby expressly incorporated by reference, in its entirety, into the present application.

TECHNICAL FIELD

The present invention relates to a mask-integrated surface protective tape.

BACKGROUND ART

In recent years, remarkable evolution has made on the thinning of the semiconductor chip and the downsizing of the chip. In particular, the thinning is required in the IC cards with built-in semiconductor IC chips, such as a memory card and a smart card. Further, the downsizing of the chip is required in LED or LCD driving devices and the like. With the increase in these demands from now, the needs for the thinning of the semiconductor chip and the downsizing of the chip are thought of as being increased much more.

These semiconductor chips are obtained, by thinning a semiconductor wafer to a predetermined thickness in a backgrinding step, an etching step or the like, and then dividing the semiconductor wafer into individual chips through a dicing step. In this dicing step, a blade dicing method of cutting the semiconductor wafer with a dicing blade has been used. In this blade dicing method, the cutting resistance by the blade is put directly on the semiconductor wafer at the time of cutting, so that a microscopic crack (or chipping) sometimes occurs in the semiconductor chip by this cutting resistance. Occurrence of the chipping does not only deteriorate outer appearance of the semiconductor chip, but also in some cases, there is a risk that even a circuit pattern on the chip is damaged, for example, a damage of chips is occurred due to lack (or insufficiency) of the transverse strength (or deflective strength) at the time of picking up. Further, in the foregoing physical dicing step using such a blade, it is impossible to set the width of a kerf (also referred to as a scribe line or a street) which is an interval between chips to less than the thick blade width. As a result, the number (yield) of chips gotten from a sheet of wafer decreases. Further, a long time period to be taken for the processing of the wafer is also a problem.

In the dicing step, use is also made of any of various kinds of methods, other than the blade dicing method.

There is a DBG (i.e. dicing before grinding) method of, in view of the difficulty in carrying out a dicing after the thinning of the wafer, forming in first a groove with a predetermined thickness in the wafer, and then carrying out a grinding step, and thereby for achieving both the thinning and the singulation into chips at the same time. By using this method, the kerf width is similar to that in the blade dicing method. However, this method has the advantage that the transverse strength of the chip is increased, so that a damage of the chip can be suppressed.

Further, there is a laser dicing method of carrying out a dicing step with a laser.

The laser dicing method has an advantage of being able to narrow a kerf width and also to conduct the dicing in dry process. However, there is a disadvantage that a wafer surface is contaminated with a sublimate at the time of cutting with a laser. For this reason, the wafer surface sometimes necessitates being subjected to a pretreatment of protecting it with a predetermined liquid protecting material. Further, the foregoing dry process has not yet led to achievement of a complete dry process. Further, the laser dicing method allows a further speeding-up of the processing rate, compared to the blade dicing method. However, the laser dicing method remains unchanged in carrying out a processing along every one line, and therefore it takes a certain time period for producing an extremely small chip.

Further, there is a method using a wet process, such as a water-jet method of carrying out a dicing step with a water pressure.

In this method, there is a possibility that a problem occurs in the material which is sensitive to a surface contamination, such as an MEMS device, a CMOS sensor, and the like. There is also a disadvantage that narrowing of a kerf width is limited, so that a chip yield is low.

The stealth dicing method of forming a modifying layer with a laser in the thickness direction of the wafer, and then splitting the modifying layer by expansion to singulate the wafer is also known.

This method has the advantage that a kerf width can be reduced to zero and a processing can be carried out in a dry state. However, a transverse strength of the chip tends to be decreased by the thermal history at the time of forming the modifying layer. Further, silicon debris sometimes occurs at the time of splitting the modifying layer by expansion. Further, there is a risk that the collision of each adjacent chips may be bring about short (or insufficiency) of the transverse strength.

Further, as a combined method of the stealth dicing and the dicing before grinding, there is a chip-singulation method corresponding to a narrow scribe width, which forms in first a modifying layer with only a predetermined width prior to the thinning in advance, and then carrying out a grinding step from the backing-face side, thereby for achieving the thinning and the singulation into chips at the same time.

This technique improves the disadvantages of the above mentioned process, and has the advantage that a kerf width is zero and a chip yield is high and also a transverse strength is increased, because a silicon modifying layer is cleaved and singulated by a stress in the wafer backgrinding step. However, because singulation is performed in the backgrinding step, a phenomenon is sometimes occurred, in which an end side of the chip collides with an adjacent chip, and thereby that the chip corner is chipped.

In addition to the above methods, there is a plasma dicing method (for example, see Patent Literature 1).

The plasma dicing method is a method of dividing a semiconductor wafer, by selectively etching a portion which is not covered with a mask, using plasma. When this dicing method is used, segmentation of chips can be achieved selectively, and even if the scribe line is curved, the segmentation is possible with no trouble. Further, as the etching rate is very high, in recent years, this dicing method is considered one of the most suitable steps for the segmentation into chips.

CITATION LIST

Patent Literatures

Patent Literature 1: JP-A-2007-19385 ("JP-A" means unexamined published Japanese patent application)

SUMMARY OF INVENTION

Technical Problem

In the plasma dicing method, use is made of, as a plasma generating gas, a fluorine-based gas which has a very high reactivity with a wafer, such as sulfur hexafluoride ($SF_6$) and carbon tetrafluoride ($CF_4$). For this reason, a protection for a non-etched surface with a mask against such high etching rate is necessary. Therefore, a preliminary mask formation becomes necessary.

In order to form the mask, as described in Patent Literature 1, generally the technique is used which consists of: coating a resist on the surface of the wafer; and then removing the portion corresponding to a street by a photolithography, to form the mask. Therefore, in order to carry out the plasma dicing, it is required for a facility for the photolithographic step other than the plasma dicing facility. For this reason, there is a problem of increase in chip costs.

Further, because of being in a state that a mask (resist film) is remaining after the plasma-etching, it is necessarily to use a large amount of solvent to remove the mask. Nevertheless, the removal of the mask is not always completely performed, which sometimes resulted in occurrence of defective chips.

Further, there is also a disadvantage that an overall processing process gets longer period, because of undergoing a masking step with a resist.

The thickness of the semiconductor chip tends to become thinner and thinner in recent years, and even in a case where the backing-face of a semiconductor wafer is made thin as such by backgrinding, it is necessary for the mask to adhere satisfactorily to the patterned surface of the semiconductor wafer and effectively protect the patterned surface.

Furthermore, in a mask-integrated surface protective tape, after backgrinding of the semiconductor wafer, the mask-integrated surface protective tape is peeled between a temporary-adhesive layer and the mask material layer in order to leave the mask material (layer) from the mask-integrated surface protective tape on the patterned surface of the semiconductor wafer. Therefore, this peeling must be made easy, and peeling must be achieved without any adhesive deposit.

In regard to the peeling described above, it is necessary that the peeling can easily expose the mask material layer on the wafer surface, and the wafer needs to be diced into chips more reliably with high precision by means of $SF_6$ plasma. Furthermore, after performing plasma-dicing (after division of the wafer), it is required to remove the mask material of the mask material layer more reliably by $O_2$ plasma, and to highly suppress the occurrence of defective chips.

However, in the above-described step, there may be a need to laminate again the mask material (layer) that has been laminated on the patterned surface.

In this case, according to the investigation of the inventors of the present invention, it becomes important that the mask material (layer) on the patterned surface can be peeled off completely without any adhesive deposit. However, in the prior art technologies, the peeling has been achieved at a level that is not necessarily satisfactory.

Therefore, it is an object of the present invention to provide a mask-integrated surface protective tape for a plasma dicing method, the surface protective tape having an excellent protective property for a patterned surface of a semiconductor wafer in a backgrinding step with a high degree of thinning, excellent peelability of the surface protective tape from the mask material layer, an excellent corrective lamination property of the mask material on a semiconductor wafer, and excellent removability of the mask material, and also having less adhesive deposit, reduced occurrence of defective chips, while not requiring a photolithographic process.

In addition to this, it is another object of the invention to provide, in this way, a mask-integrated surface protective tape that can highly suppress the occurrence of defective chips, exhibits high productivity, requires a short processing process, and can be produced inexpensively.

Solution to Problem

The above-described problems of the present invention are solved by the following means.

[1] A mask-integrated surface protective tape, containing:
a substrate film;
a radiation-curable temporary-adhesive layer; and
a radiation-curable mask material layer;
wherein the mask-integrated surface protective tape contains the radiation-curable temporary-adhesive layer and the radiation-curable mask material layer are provided on the substrate film in this order;
wherein the mask-integrated surface protective tape is used for a method of producing a semiconductor chip including the following steps (a) to (d); and
wherein, in the step (b), peeling occurs between the temporary-adhesive layer and the mask material layer before irradiation with radiation, and peeling occurs between the mask material layer and the patterned surface described below after irradiation with radiation:

(a) a step of, in the state of having laminated the mask-integrated surface protective tape on the side of a patterned surface of a semiconductor wafer, grinding the backing-face of the semiconductor wafer; laminating a wafer fixing tape on the backing-face side of the ground semiconductor wafer; and supporting and fixing the wafer to a ring flame;

(b) a step of, after integrally peeling both the substrate film and the temporary-adhesive layer from the mask-integrated surface protective tape thereby to expose the mask material layer on top, forming an opening by cutting a portion of the mask material layer corresponding to a street of the semiconductor wafer with a laser;

(c) a plasma-dicing step of segmentalizing the semiconductor wafer on the street by a $SF_6$ plasma, and thereby for singulating the semiconductor wafer into semiconductor chips; and (d) an ashing step of removing the mask material layer by an $O_2$ plasma.

[2] The mask-integrated surface protective tape described in the above item [1], wherein the adhesive force between the mask material layer and the temporary-adhesive layer before curing by irradiation with radiation is 2.0 N/25 mm or less.

[3] The mask-integrated surface protective tape described in the above item [1] or [2], wherein the mask material layer and the temporary-adhesive layer both contain a (meth) acrylic copolymer; and a radiation-polymerizable compound having a mass average molecular weight in the range of 2,000 to 20,000 and having a bifunctional, trifunctional, or higher-functional radiation-polymerizable functional group.

[4] The mask-integrated surface protective tape described in the above item [3], wherein the glass transition temperatures (Tg) of the (meth)acrylic copolymer contained in the mask material layer and the (meth)acrylic copolymer contained in the temporary-adhesive layer each are −25° C. to −5° C., and wherein an acid value of at least one of the (meth)acrylic copolymers is 0 to 10 mgKOH/g.

[5] The mask-integrated surface protective tape described in the above item [4], wherein the curing agents used in the mask material layer and the temporary-adhesive layer each are an isocyanate-series curing agent.

[6] The mask-integrated surface protective tape described in any one of the above items [1] to [5], wherein the curing agents used in the mask material layer and the temporary-adhesive layer each are an epoxy-series curing agent.

Effects of Invention

According to the present invention, it is possible to provide a mask-integrated surface protective tape for a plasma dicing method, the surface protective tape having an excellent protective property for a patterned surface of a semiconductor wafer in a backgrinding step with a high degree of thinning, excellent peelability of the surface protective tape from the mask material layer, an excellent corrective lamination property of the mask material on a semiconductor wafer, and excellent removability of the mask material, and also having less adhesive deposit, reduced occurrence of defective chips, while not requiring a photolithographic process.

In addition to this, it makes possible to provide, in this way, a mask-integrated surface protective tape that can highly suppress the occurrence of defective chips, exhibits high productivity, requires a short processing process, and can be produced inexpensively.

Other and further features and advantages of the invention will appear more fully from the following description, appropriately referring to the accompanying drawings.

BRIEF DESCRIPTION OF DRAWINGS

FIG. 2(a) shows a semiconductor wafer, fragmentary FIG. 2(b) shows how the mask-integrated surface protective tape is laminated onto the semiconductor wafer, and fragmentary FIG. 2(c) shows a semiconductor wafer on which the mask-integrated surface protective tape is laminated.

FIG. 3(a) shows thinning step of the semiconductor wafer, fragmentary FIG. 3(b) shows how a wafer-fixing tape is laminated, and fragmentary FIG. 3(c) shows a state in which the semiconductor wafer is fixed to a ring flame.

FIG. 4(a) shows how the surface protective tape is peeled off from the mask-integrated surface protective tape while leaving the mask material layer, fragmentary FIG. 4(b) shows a state in which the mask material layer of the mask-integrated surface protective tape is exposed (uncovered), and fragmentary FIG. 4(c) shows a step of cutting off the mask material layer corresponding to the street with a laser.

FIG. 5(a) shows how the plasma dicing is carried out, fragmentary FIG. 5(b) shows a state in which the semiconductor wafer is singulated into chips, and fragmentary FIG. 5(c) shows how the plasma ashing is carried out.

FIG. 6(a) shows a state, in which the mask material layer is removed, and fragmentary FIG. 6(b) shows how the chip is picked up.

FIGS. 7(a) to 7(d) are schematic cross-sectional views illustrating a step of performing corrective lamination of the mask material layer using the mask-integrated surface protective tape of the present invention. In the views, fragmentary FIG. 7(a) shows how the mask-integrated surface protective tape of the present invention is laminated to a semiconductor wafer, fragmentary FIG. 7(b) shows how the mask material layer only is left, fragmentary FIG. 7(c) shows how the surface protective tape is relaminated in order to correctively laminate the mask material layer, and the surface protective tape is irradiated with ultraviolet radiation through the temporary-adhesive layer, and fragmentary FIG. 7(d) shows how the mask material layer is peeled off.

MODE FOR CARRYING OUT THE INVENTION

The mask-integrated surface protective tape of the present invention is used for the method of obtaining a semiconductor chip by dividing and singulating a semiconductor wafer with a plasma dicing.

As described below, by using the mask-integrated surface protective tape of the present invention, a photolithography process prior to the plasma dicing step becomes unnecessary, whereby production costs of the semiconductor chips and the semiconductor products can be largely suppressed.

Furthermore, in a case where there is a need to laminate once again the mask material (layer) that has been laminated on the patterned surface, the mask material (layer) on the patterned surface can be completely peeled off without any adhesive deposit.

Figure 1:
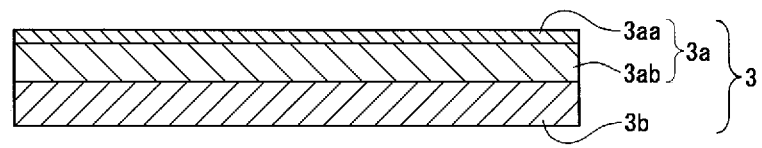
FIG. 1 is a schematic outline cross-sectional view illustrating the mask-integrated surface protective tape of the present invention.

As shown in FIG. 1, the mask-integrated surface protective tape 3 of the present invention includes a substrate film 3aa; a radiation-curable temporary-adhesive layer 3ab provided thereon; and a mask material layer provided on this temporary-adhesive layer. This mask material layer is a radiation-curable mask material layer 3b.

Here, the portion having the radiation-curable temporary-adhesive layer 3ab on the substrate film 3aa is the surface protective tape 3a.

The mask-integrated surface protective tape of the present invention is such that the dicing method is used as a plasma dicing method as described above, that is, the mask-integrated surface protective tape is a mask-integrated surface protective tape for a plasma dicing method.

More specifically, on the occasion of obtaining semiconductor chips from a semiconductor wafer, the mask-integrated surface protective tape is used for the production of semiconductor chips, including a step of dividing the wafer by plasma dicing and singulating semiconductor chips.

Furthermore, as described above, the mask-integrated surface protective tape is a mask-integrated surface protective tape that does not need a photolithography process.

The mask-integrated surface protective tape of the present invention is used for the semiconductor processing. In more details, in order to protect a patterned surface (front surface) of the semiconductor wafer at the time of backgrinding of the semiconductor wafer, the mask-integrated surface protective tape of the present invention is used to laminate it on the patterned surface.

The mask-integrated surface protective tape of the present invention is such that the temporary-adhesive layer and the mask material layer are both radiation-irradiatable type layers.

For this reason, in a step of peeling before curing by irradiating with radiation as shown in fragmentary FIG. 7(a), the mask material layer and the temporary-adhesive layer are peeled, and in a case where there is a need to laminate once again the mask material (layer) that has been laminated on the patterned surface, since the mask material layer is of radiation-irradiatable type, the mask material layer can be irradiated with radiation such as ultraviolet radiation through the temporary-adhesive layer side as shown in fragmentary FIG. 7(c), and the mask material (layer) on the patterned surface can be completely peeled off without any adhesive deposit as shown in fragmentary FIG. 7(d). Furthermore, since the temporary-adhesive layer is of radiation-irradiatable type, the temporary-adhesive layer and the mask material layer are crosslinked together to be substantially integrated, and thereby peeling between the temporary-adhesive layer and the mask material layer is made difficult.

Meanwhile, in the present invention, the step shown in fragmentary FIG. 7(b) may be omitted.

Hereinafter, the mask-integrated surface protective tape of the present invention will be described in detail together with a step for producing a semiconductor chip (processing step for a semiconductor wafer).

The mask-integrated surface protective tape of the present invention is preferably used in the production of the semiconductor chip containing at least the following steps (a) to (d).

That is, the mask-integrated surface protective tape of the present invention is a mask-integrated surface protective tape for a method of producing semiconductor chips including the following steps (a) to (d).

[Steps (a) to (d)]

(a) A step of, in the state of having laminated the mask-integrated surface protective tape on the side of a patterned surface of a semiconductor wafer, grinding the backing-face of the semiconductor wafer; laminating a wafer fixing tape on the backing-face side of the ground semiconductor wafer; and supporting and fixing the wafer to a ring flame.

(b) A step of, after integrally peeling both the substrate film and the temporary-adhesive layer from the mask-integrated surface protective tape (in other words, after peeling a surface protective tape from the mask-integrated surface protective tape) thereby to expose the mask material layer on top, forming an opening by cutting a portion of the mask material layer corresponding to a street of the semiconductor wafer with a laser.

(c) A plasma-dicing step of segmentalizing the semiconductor wafer at the street with $SF_6$ plasma, and thereby for singulating the semiconductor wafer into semiconductor chips.

(d) An ashing step of removing the mask material layer with $O_2$ plasma.

In the method of producing a semiconductor chip applied by the mask-integrated surface protective tape of the present invention, the following step (e), after the step (d), is preferably included. When the production method includes the following step (e), the following step (f) is preferably included after the step (e).

(e) A step of picking up the semiconductor chip from the wafer-fixing tape.

(f) A step of transiting the picked-up semiconductor chip to a die bonding step.

As described above, the mask-integrated surface protective tape of the present invention has a substrate film, a radiation-curable temporary-adhesive layer provided on the substrate film, and a mask material layer provided on the radiation-curable temporary-adhesive layer. In the present specification, a laminated body containing a substrate film and a temporary-adhesive layer provided on this substrate film is sometimes called as "a surface protective tape (surface protective tape 3a)" as shown in FIG. 1. In other words, the mask-integrated surface protective tape of the present invention is a tape having a laminated structure in which the mask material layer has been further provided on the temporary-adhesive layer of the surface protective tape.

The mask-integrated surface protective tape of the present invention is such that the temporary-adhesive layer and the mask material layer are of radiation-curable type (that is, having characteristics of being cured when irradiated with radiation).

In the case of the mask-integrated surface protective tape of the present invention, the above-described step (b) includes a step of integrally peeling the substrate film and the temporary-adhesive layer from the mask-integrated surface protective tape, without irradiating the surface protective tape with radiation, and exposing the mask material layer to the surface.

Since the interlayer adhesiveness between the mask material layer and the temporary-adhesive layer is enhanced by curing the temporary-adhesive layer and the mask material (layer) by irradiating the layers with radiation, when there is a need to laminate the mask material again to a semiconductor wafer, the surface protective tape is laminated again on the mask material exposed on the semiconductor wafer and is irradiated with radiation, and thus the mask material (layer) can be removed.

In the following description, steps (a) to (d) that are applied to a method for producing a semiconductor chip as a use application where the mask-integrated surface protective tape of the present invention will be described in detail.

Preferable embodiments of the method of producing a semiconductor chip using the mask-integrated surface protective tape of the present invention (hereinafter, simply referred to as "production method to which the present invention is applied") are described below with reference to the drawings. However, the present invention is not limited to the following embodiments, except for the requirements defined by the present invention. Further, the form shown in each drawing is a schematic view for facilitating the understanding of the present invention. Therefore, regarding the size, the thickness, the relative magnitude relation and the like of each component, the large one or the small one is sometimes changed for the purpose of illustration, and the form does not show a real relation as it is. Further, the present invention is not limited to outer forms and shapes shown in these figures, except for the requirements defined by the present invention.

Note that, as the apparatus, the materials and the like used in the following embodiments, an ordinary apparatus, materials and the like which have been conventionally used in the processing of the semiconductor wafer may be used, unless otherwise indicated, and the conditions of use for them can be appropriately set and optimized in accordance with the intended use within a range of an ordinary method for using. Further, omitted are duplicated descriptions about the materials, structures, methods, effects, and the like, which are common to each embodiment.

A production method to which the mask-integrated surface protective tape of the present invention is applied is described with reference to FIG. 2 to FIG. 6.

Figure 2A:
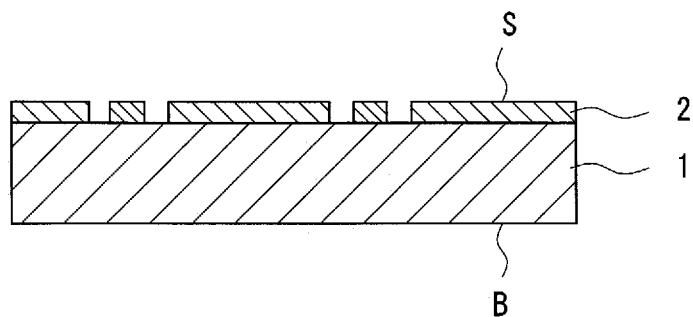
FIGS. 2(a) to 2(c) are schematic cross-sectional views illustrating steps to laminating a surface protective tape onto a semiconductor wafer using the mask-integrated surface protective tape of the present invention. In the views, fragmentary
Figure 2B:
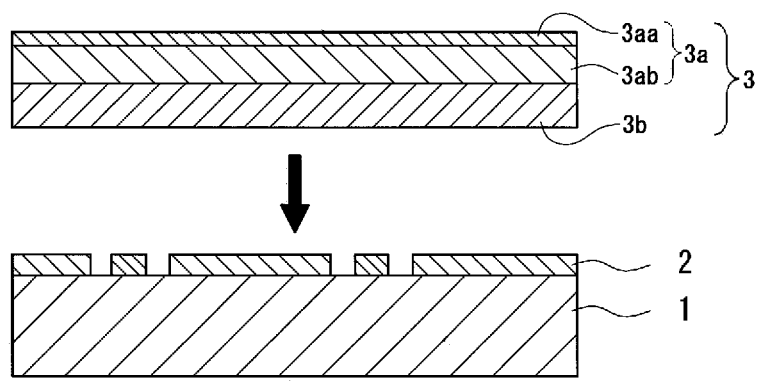
Figure 2C:
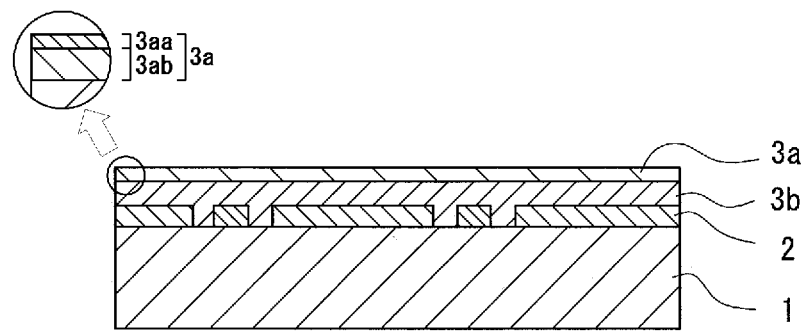

A semiconductor wafer 1 has a patterned face 2 on the surface S of which a circuit or the like of the semiconductor device is formed (see FIG. 2(a)). On this patterned surface 2, a mask-integrated surface protective tape 3 in which a mask material layer 3b has been further provided on a temporary-adhesive layer 3ab of a surface protective tape 3a in which the temporary-adhesive layer 3ab has been provided on a substrate film 3aa, is laminated (see FIG. 2(b)), whereby a semiconductor wafer 1 whose patterned surface 2 is covered with the mask-integrated surface protective tape 3 is obtained (see FIG. 2(c)).

Figure 3A:
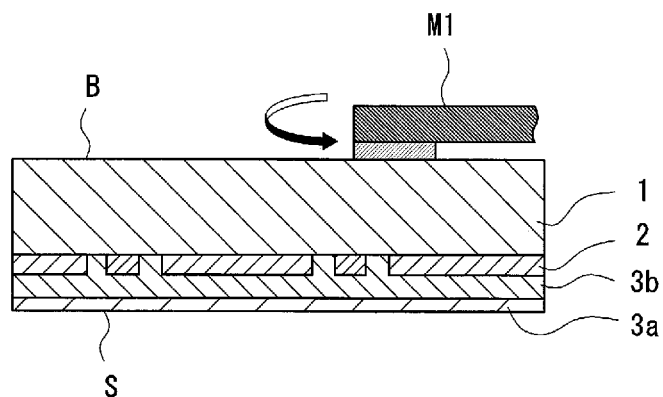
FIGS. 3(a) to 3(c) are schematic cross-sectional views illustrating steps to thinning and fixing of the semiconductor wafer using the mask-integrated surface protective tape of the present invention. In the views, fragmentary
Figure 3B:
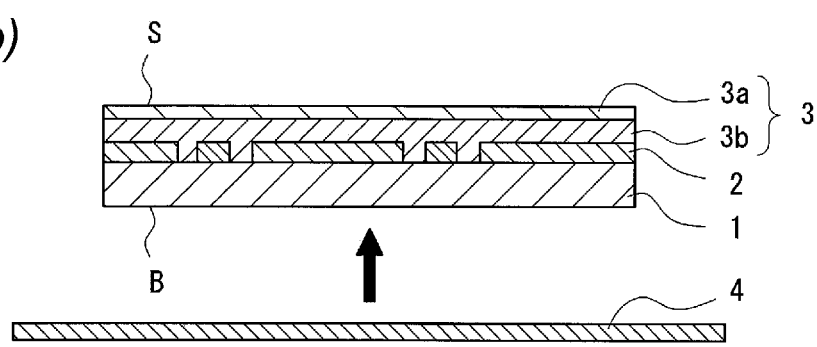
Figure 3C:
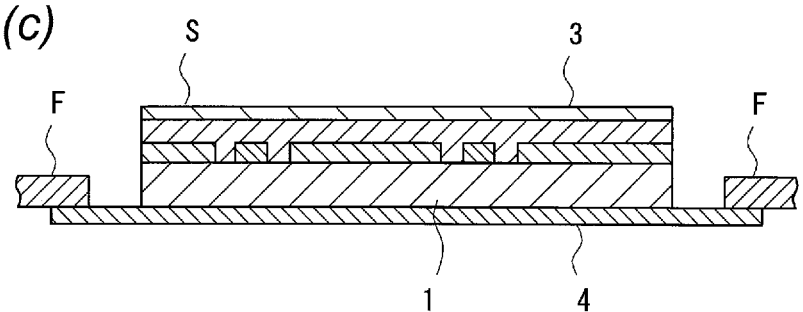

Then, the backing-face B of the semiconductor wafer 1 is ground by a wafer-grinding apparatus M1, to thin a thickness of the semiconductor wafer 1 (see FIG. 3(a)). On the ground backing-face B, a wafer-fixing tape 4 is laminated (see FIG. 3(b)), to support and fix the wafer to a ring flame F (see FIG. 3(c)).

Figure 4A:
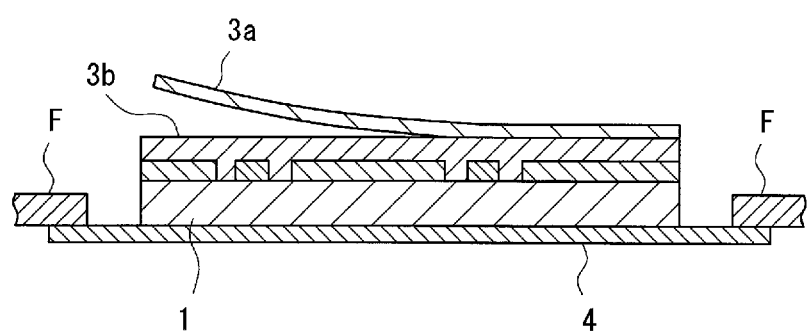
FIGS. 4(a) to 4(c) are schematic cross-sectional views illustrating steps to the mask formation using the mask-integrated surface protective tape of the present invention. In the views, fragmentary
Figure 4B:
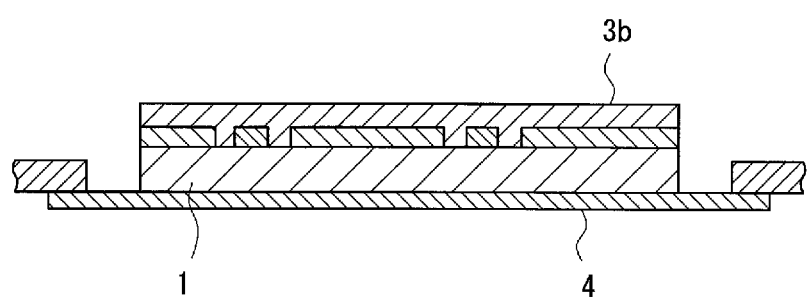
Figure 4C:
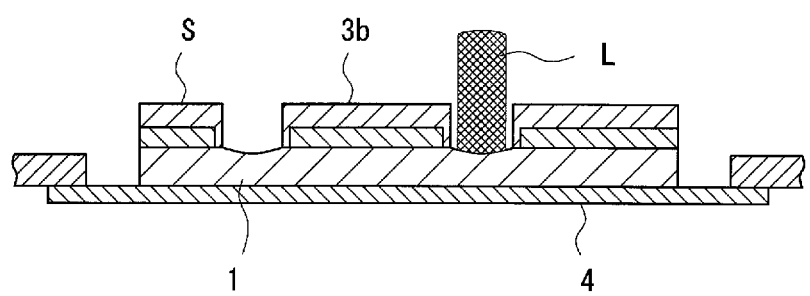

The surface protective tape 3a of the mask-integrated surface protective tape 3 is peeled off from the semiconductor wafer 1, while leaving the mask material layer 3b on the semiconductor wafer 1 (see FIG. 4(a)), so that the mask material layer 3b is exposed (uncovered) (see FIG. 4(b)). Further, $CO_2$ laser L is irradiated from the surface S side toward a plurality of streets (not shown) appropriately formed in a grid pattern or the like onto the patterned face 2, thereby to remove a portion corresponding to a street of the mask material layer 3b, so that streets of the semiconductor wafer are opened (see FIG. 4(c)).

Figure 5A:
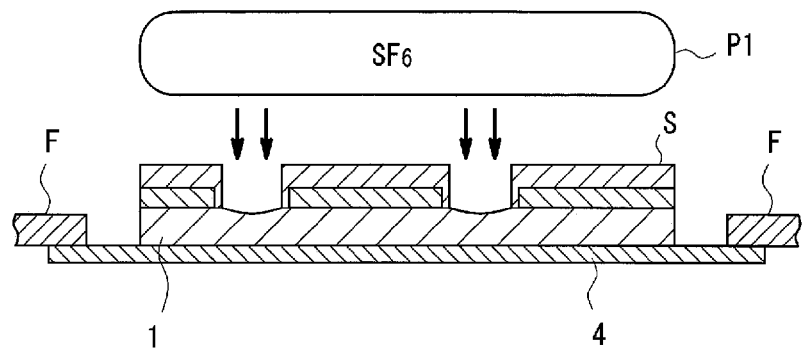
FIGS. 5(a) to 5(c) are schematic cross-sectional views illustrating the plasma dicing and plasma ashing steps using the mask-integrated surface protective tape of the present invention. In the views, fragmentary
Figure 5B:
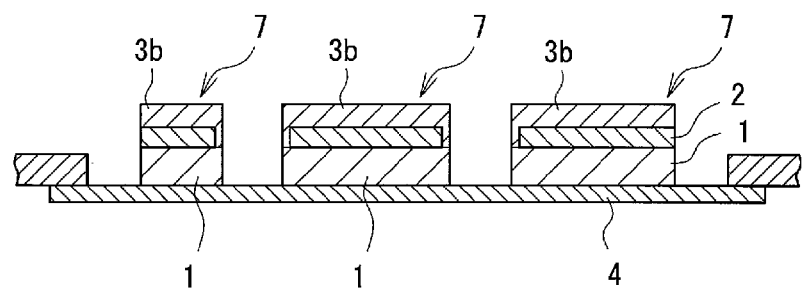
Figure 5C:
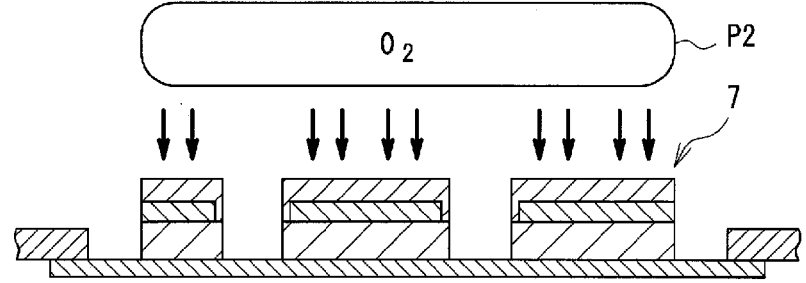
Figure 6A:
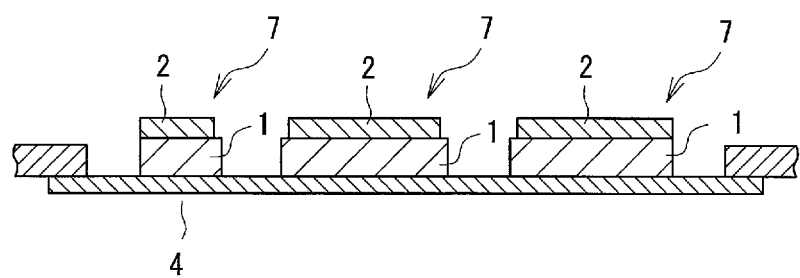
FIGS. 6(a) and 6(b) are schematic cross-sectional views illustrating steps to picking up a chip using the mask-integrated surface protective tape of the present invention. In the views, fragmentary
Figure 6B:
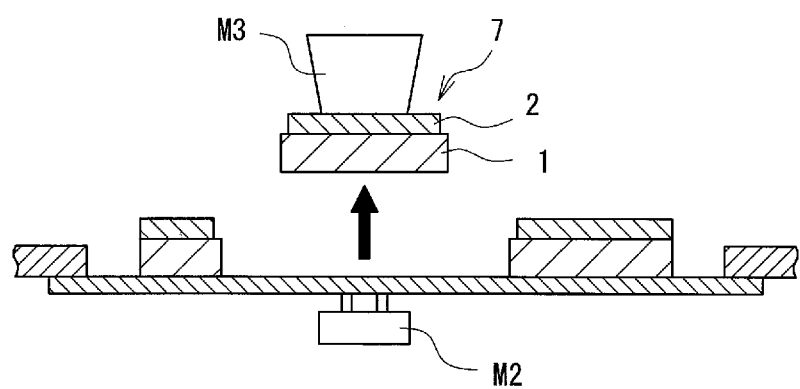

Then, a treatment with the plasma P1 of $SF_6$ gas is carried out from the surface S side, thereby to etch the semiconductor wafer 1 which is exposed at the street portion (see FIG. 5(a)), and the semiconductor wafer is divided into individual chips 7, which results in singulation (see FIG. 5(b)). After that, ashing with the plasma P2 of $O_2$ gas is carried out (see FIG. 5(c)), thereby to remove the mask material layer 3b remaining on the surface S (see FIG. 6(a)). Then, at last, the singulated chip 7 is knocked up by a pin M2, and is picked up by adsorption with a collet M3 (see FIG. 6(b)).

Herein, a process of etching of Si of the semiconductor wafer with the use of $SF_6$ gas is also called as a BOSCH process. This process allows a reaction of the exposed Si and a fluorine atom formed from a plasmarized $SF_6$, thereby to remove the exposed Si as silicon tetrafluoride ($SiF_4$), which is also called as reactive ion etching (RIE). On the other hand, the removal with the $O_2$ plasma is a method which is also used as plasma cleaner in the course of a semiconductor production process, and is also called as ashing (ash-making), which is one of means for removal of the organic substance. This method is carried out, in order to clean an organic substance deposit remaining on a semiconductor device surface.

Next, the materials used in the mask-integrated surface protective tape 3 and the materials used in the above-described processes will be described.

Meanwhile, the materials used in the above-described step in addition to the materials used in the mask-integrated surface protective tape 3 are not limited to those described below.

The semiconductor wafer 1 is a silicon wafer, on its one side, having the patterned face 2 on which the circuit or the like of the semiconductor device is formed. The patterned face 2 is a face on which the circuit or the like of the semiconductor device is formed, which has a street in a planar view.

The mask-integrated surface protective tape 3 of the present invention contains the temporary-adhesive layer 3ab provided on the substrate film 3aa, and further the mask material layer 3b provided on the temporary-adhesive layer 3ab, and has a function to protect the semiconductor device formed on the patterned face 2. Specifically, at the wafer-thinning step (backgrinding step) which is a post-step, the semiconductor wafer 1 is supported by the patterned face 2, and the backing-face of the semiconductor wafer is ground. Therefore, the mask-integrated surface protective tape 3 needs to withstand a load in grinding. For this reason, the mask-integrated surface protective tape 3 is different from a mere resist film or the like, and has: the thickness enough to coat the device formed on the patterned face; and the pressing resistance which is low, and has: a high adhesiveness that can adhere tightly to the device, so that the infiltration of dusts, grinding water, and the like, in grinding, is not occurred.

Out of the mask-integrated surface protective tape 3 of the present invention, the substrate film 3aa is composed of a plastic, a gum, or the like, and examples of its materials include: a homopolymer or copolymer of α-olefin, such as a polyolefin resin including polyethylene, polypropylene and ethylene/propylene copolymer, polybutene-1, poly-4-methylpentene-1, ethylene/vinyl acetate copolymer, ethylene/acrylic acid copolymer, and ionomers, or a mixture thereof; an elemental substance or a mixture of 2 or more kinds, such as polyethylene terephthalate, polyethylene naphthalate, polyphenylene sulfide, polyether imide, polyimide, polycarbonate, polymethyl methacrylate, polyurethane, and styrene/ethylene/butene- or pentene-based copolymer; and a resin composition in which another resin, a filler, an additive or the like is blended with any of the foregoing polymers. These can be arbitrary selected depending on the required characteristics.

The substrate film 3aa preferably has a layer composed of a polyolefin resin. In this case, the substrate film 3aa may be a single layer composed of a polyolefin resin layer, or may have a multi-layer structure of two or more layers composed of a polyolefin resin layer and other resin layer. A laminate of a low-density polyethylene and an ethylene/vinyl acetate copolymer, a laminate of a polypropylene and a polyethylene terephthalate, a polyethylene terephthalate, or a polyethylene naphthalate is one of preferable materials.

The foregoing substrate film 3aa can be produced using a general extrusion method. In the case where the substrate film 3aa is obtained by laminating various resins, these are produced by a co-extrusion method, a lamination method or the like. At this time, as conventionally practiced in the ordinary production method of the laminate film, an adhesion layer may be provided between resins. A thickness of the substrate film 3aa is preferably from 20 to 200 μm, from the viewpoint of strength/elongation property, and radiation permeation property.

The temporary-adhesive layer 3ab takes a role in protection of the patterned surface together with a mask material by covering an asperity of the device formed on the patterned surface to enhance adhesion property to the patterned surface. In order to make the mask-integrated surface protective tape withstand a load of the wafer-thinning step, it is preferable that the adhesion property of the temporary-adhesive layer 3ab to a mask material layer 3b or a substrate film 3aa in the wafer-thinning step is high. On the other hand, after the wafer-thinning step, because the temporary-adhesive layer 3ab is integrally peeled with the substrate film 3aa from the mask material layer 3b, it is preferable that the adhesion property of the temporary-adhesive layer to the mask material layer is low (high peeling property is preferable). Furthermore, when there is a need to correctively laminate the mask material on the patterned surface of a semiconductor wafer, it is preferable that the adhesiveness between the mask material and the temporary-adhesive layer of the surface protective tape that has been relaminated on the mask material (layer) is high. In order to realize such characteristics at a higher level, the temporary-adhesive layer 3ab and the mask material layer 3b of the mask material-integrated surface protective tape of the present invention are of radiation-curable type. When the temporary-adhesive layer 3ab and the mask material 3b are made into radiation-curable type layers, the temporary-adhesive layer and the mask material layer form three-dimensional networks as a result of irradiation with radiation, and the adhesive force is enhanced. Therefore, the mask material layer can be easily peeled off from the patterned surface by using the surface protective tape from which the mask material has been peeled off once.

In the present specification, the term "radiation" is a concept including both a light beam such as ultraviolet, and an ionizing radiation such as an electron beam. The radiation for use of the present invention is preferably ultraviolet.

In the mask-integrated surface protective tape of the present invention, the temporary-adhesive layer 3ab contains a (meth)acrylic copolymer. Herein, the phrase "the temporary-adhesive layer 3ab contains a (meth)acrylic copolymer" means to incorporate an embodiment in which the (meth)acrylic copolymer exists in a reacted state with a curing agent described below.

Here, as in the case of a (meth)acrylic compound, the parentheses of the term "(meth)" means that this may exist or may not exist, and for example, a (meth)acrylic compound may be any one of an acrylic compound, a methacrylic compound, and a compound including both of these.

In the present specification, examples of the (meth)acrylic copolymer include a copolymer having a (meth)acrylic acid ester as a constituent, or a mixture of these copolymers.

The mass-average molecular weight of these polymers is normally about 300,000 to 1,000,000.

A proportion of the (meth)acrylic acid ester component of the total monomer component of the (meth)acrylic copolymer is preferably 70% or more, more preferably 80% or more, and further more preferably 90% or more. Further, in a case where the proportion of the (meth)acrylic acid ester component of the total monomer component of the (meth)acrylic copolymer is not 100% by mole, it is preferable that the remaining monomer component is a monomer component ((meth)acrylic acid and the like) existing in the form of (meth)acryloyl group polymerized as a polymerizable group.

Further, the proportion of the (meth)acrylic acid ester component having a functional group (for example, hydroxyl group) reacting with a curing agent described below, of the total monomer component of the (meth)acrylic copolymer is preferably 1% by mole or more, more preferably 2% by mole or more, further more preferably 5% by mole or more, and still further more preferably 10% by mole or more. A proportion of the (meth)acrylic acid ester component is preferably 35% by mole or less, more preferably 25% by mole or less.

The above-described (meth)acrylic acid ester component may be a (meth)acrylic acid alkyl ester (also referred to as alkyl (meth)acrylate). In this case, the number of carbon atoms of the alkyl group which constitutes the (meth)acrylic acid alkyl ester is preferably from 1 to 20, more preferably from 1 to 15, and further more preferably from 1 to 12.

The content (content converted to the state before reacting with a curing agent) of the (meth)acrylic copolymer in the temporary-adhesive layer 3ab is preferably 80% by mass or more, more preferably 90% by mass or more, and still more preferably from 95 to 99.9% by mass.

In a case where the temporary-adhesive layer 3ab is composed of a radiation-curable temporary-adhesive, a temporary-adhesive containing an acrylic temporary-adhesive and a radiation-polymerizable compound may be preferably used.

The acrylic temporary-adhesive is a (meth)acrylic copolymer, or a mixture of a (meth)acrylic copolymer and a curing agent.

The curing agent is used to adjust an adhesive force and a cohesion force by reacting it with a functional group which the (meth)acrylic copolymer has.

Examples thereof include: an epoxy compound having 2 or more epoxy groups in the molecule (hereinafter, also referred to as "epoxy-series curing agent"), such as 1,3-bis(N,N-diglycidyl aminomethyl)cyclohexane, 1,3-bis(N,N-diglycidyl aminomethyl)toluene, 1,3-bis(N,N-diglycidyl aminomethyl)benzene, N,N,N',N'-tetraglycidyl-m-xylenediamine, ethylene glycol diglycidyl ether, or terephthalic acid diglycidyl ester acrylate; an isocyanate compound having 2 or more isocyanate groups in the molecule (hereinafter, also referred to as "isocyanate-series curing agent"), such as 2,4-tolylenediisocyanate, 2,6-tolylenediisocyanate, 1,3-xylylenediisocyanate, 1,4-xylylenediisocyanate, diphenylmethane-4,4'-isocyanate, hexamethylene diisocyanate, isophorone diisocyanate, or an adduct type of these; an aziridine compound having 2 or more aziridinyl groups in the molecule (aziridine-series curing agent), such as tetramethylol-tri-β-aziridinyl propionate, trimethylol-tri-β-aziridinyl propionate, trimethylolpropane-tri-β-aziridinyl propionate, trimethylolpropane-tri-β-(2-methylaziridine) propionate, tris-2,4,6-(1-aziridinyl)-1,3,5-triazine, tris[1-(2-methyl)-aziridinyl]phosphine oxide, or hexa[1-(2-methyl)-aziridinyl]triphosphatriazine; and the like.

An addition amount of the curing agent may be adjusted depending on a desired adhesion force, and is suitably from 0.1 to 5.0 mass parts with respect to 100 mass parts of the (meth)acrylic copolymer. In the temporary-adhesive layer of the mask-integrated surface protective tape used of the present invention, the curing agent is in a state of having reacted with the (meth)acrylic copolymer.

As for the radiation-polymerizable compound described above, a low-molecular weight compounds having, in the molecule, at least two or more photopolymerizable carbon-carbon double bonds which can be three-dimensionally reticulated by radiation irradiation are widely used.

Specifically, use may be widely applicable of: trimethylolpropane triacrylate, tetramethylolmethane tetraacrylate, pentaerythritol triacrylate, pentaerythritol tetraacrylate, dipentaerythritol mono-hydroxypentaacrylate, dipentaerythritol hexaacrylate, 1,4-butyleneglycol diacrylate, 1,6-hexanediol diacrylate, polyethyleneglycol diacrylate, and acrylate-based compounds such as oligo-ester acrylates.

Further, in addition to the acrylate-based compounds, use can be also made of a urethane acrylate-based oligomer.

The urethane acrylate-based oligomer is obtained by conducting reaction of an acrylate or methacrylate having a hydroxy group (for example, 2-hydroxyethyl acrylate, 2-hydroxyethyl methacrylate, 2-hydroxypropyl acrylate, 2-hydroxypropyl methacrylate, polyethyleneglycol acrylate, polyethyleneglycol methacrylate, and the like) with a urethane prepolymer having an isocyanate group at the end thereof, which is obtained by conducting reaction of a polyol compound, such as a polyester type- or a polyether type-polyol, and a polyvalent isocyanate compound (for example, 2,4-tolylene diisocyanate, 2,6-tolylene diisocyanate, 1,3-xylylene diisocyanate, 1,4-xylylene diisocyanate, diphenyl methane-4,4'-diisocyanate, and the like).

From the viewpoint of compatibility to the acrylic temporary-adhesive, the mass-average molecular weight of the above-described radiation-polymerizable compound is preferably 2,000 to 20,000, more preferably 2,300 to 10,000, and further preferably 2,500 to 5,000.

Meanwhile, in the present invention, the mass-average molecular weight refers to the mass average molecular weight in terms of standard polystyrene measured by means of gel permeation chromatography (GPC).

As a blending ratio of the acrylic temporary-adhesive and the radiation-polymerizable compound in the radiation-curable temporary-adhesive, the radiation-polymerizable compound is desirably blended in the range of 50 to 200 mass parts and preferably 50 to 150 mass parts with respect to 100 mass parts of the acrylic temporary-adhesive. When the mixing ratio is in this range, the adhesiveness to the mask material layer after irradiation with radiation can be enhanced.

Further, as the radiation-curable temporary-adhesive used in the temporary-adhesive layer 3ab, it is also preferable to use a radiation-polymerizable (meth)acrylic copolymer in which the above-described (meth)acrylic copolymer itself has been rendered radiation-polymerizable.

In this case, the radiation-curable temporary-adhesive may contain a curing agent.

The radiation-polymerizable (meth)acrylic copolymer is a copolymer having, in the molecule of the copolymer, a reactive group which is capable of realizing a polymerization reaction upon exposure to a radiation, particularly to an ultraviolet.

As the reactive group, an ethylenically unsaturated group, in other words, a group having a carbon-carbon double bond (ethylenically unsaturated bond), is preferred. Examples thereof include: a vinyl group, an allyl group, a styryl group, a (meth)acryloyloxy group, a (meth)acryloylamino group, and the like.

The introduction of the above-described reactive group to the copolymer may be performed, for example, by reacting a copolymer having a hydroxyl group with a compound having both a group (for example, isocyanate group) reacting with the hydroxyl group and the above-described reactive group [representatively 2-(methacryloyloxy)ethyl isocyanate].

It is preferable that a (meth)acrylic acid alkyl ester component of which the number of carbon atoms is from 8 to 12 is contained in the monomer components which constitute the (meth)acrylic copolymer having an ethylenically unsaturated bond at the side chain thereof, which constitutes the temporary-adhesive layer 3ab of the mask-integrated surface protective tape of the present invention. Of the monomer components which constitute the (meth)acrylic copolymer having an ethylenically unsaturated bond at the side chain thereof, the percentage of the (meth)acrylic acid alkyl ester component of which the number of carbon atoms is from 8 to 12 is preferably from 45 to 85% by mole, and more preferably from 50 to 80% by mole.

Further, in the case of conducting polymerization and curing of a temporary-adhesive layer 3ab by radiation, a photopolymerization initiator, for example, isopropylbenzoin ether, isobutylbenzoin ether, benzophenone, Michler's ketone, chlorothioxanthone, benzyl methyl ketal, α-hydroxycyclohexyl phenyl ketone, 2-hydroxymethylphenyl propane, and the like can be used. By adding at least one of these compounds to the temporary-adhesive layer, a polymerization reaction can be efficiently accelerated.

The temporary-adhesive layer 3ab may further contain a photosensitizer, any of known tackifier, softener, antioxidant, or the like.

As for the temporary-adhesive layer 3ab, those embodiments described at paragraphs [0036] to [0055] of JP-A-2014-192204 are also preferably applied.

The thickness of the temporary-adhesive layer 3ab is preferably from 5 to 30 µm, from the viewpoint of more increasing protective ability to the device and the like formed on the patterned surface 2, and more increasing adhesion to the patterned surface. In this regard, depending on the variety of the device, an asperity of the patterned surface is approximately about a few micrometers to about 15 µm.

In the mask material layer 3b, a (meth)acrylic copolymer is contained.

Herein, the phrase "a (meth)acrylic copolymer is contained in the mask material layer 3b" means to incorporate an embodiment in which the (meth)acrylic copolymer exists in a reacted state with a curing agent.

In the mask material layer 3b, a radiation-curable temporary-adhesive is preferably used. As this radiation-curable temporary-adhesive, a mixture of the above-described (meth)acrylic copolymer and a curing agent may be preferably used.

When the mask material layer 3b and the temporary-adhesive layer 3ab are both radiation-curable temporary-adhesives, three-dimensional crosslinking between the mask material layer and the temporary-adhesive layer occurs after irradiation with radiation, and adhesiveness is increased. Thus, when the mask material that has been exposed to light on the patterned surface is peeled off again, the mask material can be easily peeled.

The thickness of the mask material layer 3b is preferably from 5 to 15 µm, and more preferably from 5 to 10 µm, from the view point of a removal rate in the plasma ashing.

In a case where the mask material layer 3b and the temporary-adhesive layer 3ab are both (meth)acrylic copolymers, it is preferable that the mass average molecular weight of the (meth)acrylic copolymer used in the temporary-adhesive layer 3ab is larger than the mass average molecular weight of the (meth)acrylic copolymer used in the mask material layer 3b. Among these, it is preferable that the mass average molecular weight of the (meth)acrylic copolymer used in the temporary-adhesive layer 3ab is larger by 200,000 or more, more preferably larger by 230,000 or more, and even more preferably larger by 250,000 or more, than the mass average molecular weight of the (meth)acrylic copolymer used in the mask material layer 3b.

The mask-integrated surface protective tape of the present invention is preferably such that the curing agent used for the formation of the temporary-adhesive layer 3ab and the curing agent used for the formation of the mask material layer 3b are of the same type. When curing agents of the same type are used, the adhesiveness between the mask material layer and the temporary-adhesive layer before curing by radiation is secured, and the surface protective tape can withstand thin film grinding processing.

In particular, it is preferable that an isocyanate-series curing agent is used as the curing agent for forming the temporary-adhesive layer 3ab and the mask material layer 3b. Since the control of the adhesive force can be carried out more easily than in the case of an epoxy-based curing agent, when such a configuration is adopted, it becomes easy to leave only the mask material layer on the semiconductor wafer.

In the mask-integrated surface protective tape of the present invention, the glass transition temperature (Tg) of the (meth)acrylic copolymer for forming the temporary-adhesive layer 3ab and the glass transition temperature of the (meth)acrylic copolymer for forming the mask material layer 3b each are preferably −25° C. to −5° C. As the glass transition temperature rises, the interlayer adhesive force is decreased. Therefore, peeling can be achieved easily between the mask material and the temporary-adhesive.

In the present invention, the difference (absolute value of difference) between the glass transition temperatures (Tg) of the (meth)acrylic copolymer for forming the temporary-adhesive layer 3ab and the glass transition temperature (Tg) of the (meth)acrylic copolymer for forming the mask material layer 3b is preferably 8° C. to 20° C., more preferably 8° C. to 15° C.

Herein, the Tg of the (meth)acrylic copolymer for forming the above-described temporary-adhesive layer 3ab and the Tg of the (meth)acrylic copolymer for forming the above-described mask material layer 3b each mean a Tg of the (meth)acrylic copolymer in the state before reacting with the curing agent.

The Tg can be measured using a differential scanning calorimetric analyzer (DSC-60, manufactured by Shimadzu Corporation). More specifically, the temperature rise is conducted at a rate of temperature rise of 5° C./min in a range of −100° C. to 100° C., and the extrapolated onset glass transition temperature in JIS K 7121 "Testing Method for Transition Temperature of Plastics" is defined as Tg.

[Acid Value of (meth)acrylic Polymer]

In the present invention, at least one of the (meth)acrylic polymers contained in the temporary-adhesive layer and the mask material layer has an acid value of preferably 0 to 10 mgKOH/g, more preferably 0 to 7 mgKOH/g, and further preferably 0 to 5 mgKOH/g.

In the present invention, the difference (absolute value of difference) between the acid value of the (meth)acrylic copolymer for forming the temporary-adhesive layer 3ab and the acid value of the (meth)acrylic copolymer for forming the mask material layer 3b is preferably 1.0 to 10 mgKOH/g, more preferably 2.5 to 10 mgKOH/g.

In the present invention, the acid value means mg number of potassium hydroxide necessary to neutralize a free acid present in 1 g of a (meth)acrylate polymer.

When the acid value of the (meth)acrylic polymer is in the range described above, the adhesive force between the surface protective tape and the mask material layer can be controlled. Thus, even if the Tg values are close to each other, the mask material layer and the temporary-adhesive layer of the surface protective tape can be easily detached.

Acid groups do not form covalent bonds as in the case of a curing agent. However, since acid groups form pseudo-crosslinking between them, when acid groups are included in both the temporary-adhesive layer and the mask material layer, the adhesiveness between the temporary-adhesive layer and the mask material layer is enhanced, and the mask material is not easily peeled from the surface protective tape.

The adjustment of the acid value can be adjusted as appropriate by, for example, adjusting the amount of incorporation of acrylic acid when the (meth)acrylic polymer is polymerized.

The mask-integrated surface protective tape of the present invention is preferably such that the adhesive force between the mask material layer 3b and the temporary-adhesive layer 3ab before irradiation with radiation is 2.0 N/25 mm or less. As the mask-integrated surface protective tape has such an adhesive force, when the surface protective tape is peeled off from a semiconductor wafer that has been thinned after grinding processing, the surface protective tape can be peeled off without damage to the semiconductor wafer or the like.

In the present specification, the term "adhesive force" (unit: N/25 mm) is obtained by making a 25-mm width incision in a mask-integrated surface protective tape with a cutter, and then pulling a mask material layer at a peeling rate of 300 mm/min in the direction of 180° to peel the mask material layer away from the mask-integrated surface protective tape, and measuring a stress (peeling strength) at that moment, using a TENSILON tester (AG-10 kNI (trade name), manufactured by Shimadzu Corporation).

Herein, measurement of the above-described adhesive force is conducted under the conditions that an ultraviolet ray is irradiated to all over the mask-integrated surface protective tape from the substrate film side of the tape so that the accumulated radiation dose gets to 500 mJ/cm². A high-pressure mercury lamp is used for the ultraviolet irradiation.

The wafer-fixing tape 4 is required to hold the semiconductor wafer 1 and to have resistance to plasma which is sustainable even if the wafer-fixing tape is subjected to the plasma dicing step. Further, in the picking-up step, a good picking-up property and also an expansion property and the like in some cases are required.

As the foregoing wafer-fixing tape 4, a tape similar to the surface protective tape 3a may be used. Further, use may be made of any of known dicing tapes used in a conventional plasma dicing method, which are generally called as a dicing tape. Further, the use can be also made of a dicing die-bonding tape, in which an adhesion bond for die-bonding is laminated, in order to make it easy to transit to the dicing die-bonding step after picking-up.

For the laser irradiation with which the mask material layer 3b is cut, use can be made of a laser irradiator for irradiating an ultraviolet or infrared laser light. In this laser irradiator, a laser irradiation part capable of freely moving along the street of the semiconductor wafer 1 is arranged. Laser can be irradiated, which is provided with an output controlled suitably to remove the mask material layer 3b. In particular, if $CO_2$ laser is used as a laser light, it is possible to obtain a large power of several to tens of watts. $CO_2$ laser can be preferably used for the present invention.

In order to carry out the plasma dicing and the plasma ashing, use can be made of a plasma-etching apparatus. The plasma-etching apparatus is an apparatus, which is capable of subjecting the semiconductor wafer 1 to dry etching, and in which a sealed treatment space is made in a vacuum chamber, to place the semiconductor wafer 1 on the side of the electrode for a high-frequency wave. A gas for plasma generation is supplied from the side of a gas-supplying electrode provided facing the electrode for high-frequency wave. If a high-frequency voltage is applied to the electrode for a high-frequency wave, plasma is generated between the gas-supplying electrode and the electrode for a high-frequency wave. Therefore, the resultant plasma is used. By circulating a refrigerant in a heat-producing electrode for high-frequency wave, it is possible to prevent a temperature elevation of the semiconductor wafer 1 due to the heat of this plasma.

In accordance with the method of producing the semiconductor chip (the method of processing the semiconductor wafer), any photolithographic step or the like becomes unnecessary, which is provided with a resist to be used in the conventional plasma dicing process, by giving a mask function in the plasma dicing to the surface protective tape protecting the patterned face. In particular, by using the surface protective tape, a technique becomes unnecessary, in which a high level of alignment, such as printing and transferring, is required for the mask formation. The mask-integrated surface protective tape can be easily laminated on the semiconductor wafer surface, and a mask can be easily formed by the laser equipment.

Further, the mask material layer 3b can be removed with $O_2$ plasma, and therefore removal of the mask portion can be carried out by the same apparatus as the plasma dicing apparatus. In addition, the plasma dicing is carried out from the patterned face 2 side (surface S side), and therefore it is not necessary to turn the chip upside down before the picking-up operation.

From these reasons, the facilities can be simplified, and process costs can be considerably suppressed.

EXAMPLES

The present invention will be described in more detail based on examples given below, but the invention is not meant to be limited by these.

[Example 1] Production of Mask-Integrated Surface Protective Tape, and Production of Semiconductor Chip <Production of Mask-Integrated Surface Protective Tape>

Were mixed 44 mol % of butyl acrylate, 50 mol % of lauryl acrylate and 6.0 mol % of 2-hydroxyethyl acrylate. The mixture was subjected to a solution polymerization to obtain a solution of (meth)acrylic copolymer having a mass-average molecular weight of 650,000, an acid value of 0 mgKOH/g and Tg of −15° C.

To 100 mass parts of this obtained (meth)acrylic copolymer, 100 mass parts of 6-valent urethane acrylate oligomer having mass-average molecular weight of 3,500 (manufactured by Shin Nakamura Chemical Co., Ltd.) and 50 mass parts of 3-valent urethane acrylate oligomer (manufactured by Shin Nakamura Chemical Co., Ltd.) as ultraviolet-sensitive resins, 4.0 mass parts of COLONATE L (manufactured by Nippon Polyurethane Industry Co., Ltd.) as a curing agent, and 10 mass parts of IRGACURE 184 (manufactured by BASF) as a photopolymerization initiator were blended to obtain a temporary-adhesive composition A.

An acrylic copolymer (mass-average molecular weight: 400,000, hydroxyl value: 0 mg KOH/g, acid value: 9.8 mg KOH/g, Tg: −23° C.) was synthesized by mixing 20 mol % of acrylic acid, 70 mol % of butyl acrylate and 10 mol % of methyl acrylate and subjecting the mixture solution to polymerization.

To 100 mass parts of this acrylic copolymer solution, 50 mass parts of 6-valent urethane acrylate oligomer having mass-average molecular weight of 3,000 (manufactured by Shin Nakamura Chemical Co., Ltd.) and 50 mass parts of 3-valent urethane acrylate oligomer (manufactured by Shin Nakamura Chemical Co., Ltd.) as ultraviolet-sensitive resins, 4.0 mass parts of COLONATE L (manufactured by Nippon Polyurethane Industry Co., Ltd.) as a curing agent, and 10 mass parts of IRGACURE 184 (manufactured by BASF) as a photopolymerization initiator were blended to obtain a temporary-adhesive composition B.

The above-described temporary-adhesive composition A was coated as a composition for forming the mask material layer on a peeling liner, and the formed temporary-adhesive layer was laminated on a 100 μm-thick LDPE (low density polyethylene) film to obtain a 130 μm-thick radiation curable surface protective tape 3a.

Further, the temporary-adhesive composition B was coated on a peeling liner so that the thickness after drying got to 5 μm, and then laminated on the surface of the temporary-adhesive layer exposed by peeling the peeling liner of the radiation curable surface protective tape 3a, whereby a 135 μm-thick radiation curable mask-integrated surface protective tape 3 was obtained.

<Production of Semiconductor Chip>

The above-obtained radiation curable mask-integrated surface protective tape was laminated on the surface of a silicon wafer (diameter: 8 inches) having thereon scribe lines (streets) using a laminator DR8500III (trade name, manufactured by Nitto Seiki Co., Ltd.).

After that, the surface (wafer backing-face) opposite to the surface on which the above-described mask-integrated surface protective tape was laminated, was ground using DGP8760 (trade name, manufactured by DISCO Corporation) until a thickness of the wafer got to 50 μm. The ground wafer was mounted on a wafer fixing tape (radiation curable dicing tape) from the wafer backing-face side using RAD-2700F (trade name, manufactured by Lintec Corporation), and was supported and fixed to a ring flame. Then, only the surface protective tape 3a was peeled while leaving only the mask material layer 3b on the wafer. Herein, from the results that only the surface protective tape 3a was peeled while leaving the mask material layer 3b, it was found that the adhesive force between the mask material layer and the temporary-adhesive layer was lower than the adhesive force between the mask material layer and the wafer.

Next, the mask material on the scribe line was removed by a $CO_2$ laser to form an opening on the scribe line.

After that, the silicon wafer was subjected to a plasma irradiation with a $SF_6$ gas as a plasma-generating gas from the mask material layer side at an etching rate of 15 μm/min for 5 minutes. By this plasma dicing, the wafer was cut and divided into individual chips. Next, the chips were subjected to ashing with an $O_2$ gas as a plasma-generating gas at an etching rate of 1.5 μm/min for 10 minutes thereby to remove the mask material. After that, an ultraviolet ray was irradiated (irradiation dose: 200 mJ/cm$^2$) from the wafer fixing tape side thereby to decrease an adhesive force of the wafer fixing tape and chips were picked up.

In the above-described Example 1, the 25 mm-width mask-integrated surface protective tape was laminated on stainless steel as a model semiconductor wafer, as shown in the fragmentary FIG. 7(a). After that, an adhesive force was measured at a peeling angle of 180° and a peeling rate of 300 mm/min. As a result, as shown in the fragmentary FIG. 7(b), in 2.0 N/25 mm, peeling between the mask material layer and the temporary-adhesive layer was confirmed.

After the above-described evaluation, the temporary-adhesive layer was laminated again on the mask material layer exposed on the wafer, as shown in fragmentary FIG. 7(c), and the temporary-adhesive layer was irradiated with ultraviolet radiation (500 mJ/cm$^2$). The adhesive force was measured at a peeling angle of 180° and a peeling rate of 300 mm/min. As shown in fragmentary FIG. 7(d), repeeling between the mask material layer and the stainless steel was confirmed. In order to check the reproducibility of this repeeling test, the repeeling test was performed ten times, and repeeling was confirmed in all of the ten times. Therefore, in Table 1, repeelability of the mask material layer is "⊙".

[Example 2] Production of Mask-Integrated Surface Protective Tape, and Production of Semiconductor Chip <Production of Mask-Integrated Surface Protective Tape>

Were mixed 1.5 mol % of methacrylic acid, 40.5 mol % of methyl methacrylate and 1.5 mol % of 2-hydroxyethyl acrylate. The mixture was subjected to a solution polymerization to obtain a solution of (meth)acrylic copolymer having a mass-average molecular weight of 170,000, an acid value of 11 mgKOH/g and Tg of –10° C.

To 100 mass parts of this obtained (meth)acrylic copolymer, 100 mass parts of 6-valent urethane acrylate oligomer (manufactured by Shin Nakamura Chemical Co., Ltd.) and 50 mass parts of 3-valent urethane acrylate oligomer having mass-average molecular weight of 5,000 (manufactured by Shin Nakamura Chemical Co., Ltd.) as ultraviolet-sensitive resins, 4.0 mass parts of COLONATE L (manufactured by Nippon Polyurethane Industry Co., Ltd.) as a curing agent, and 10 mass parts of IRGACURE 184 (manufactured by BASF) as a photopolymerization initiator were blended to obtain a temporary-adhesive composition C.

The above-described temporary-adhesive composition B obtained in Example 1 was coated as a composition for forming the temporary-adhesive layer on a peeling liner, and the formed temporary-adhesive layer was laminated on a 100 μm-thick LDPE (low density polyethylene) film to obtain a 140 μm-thick radiation curable surface protective tape 3a.

Further, the temporary-adhesive composition C was coated as a composition for forming the mask material layer on a peeling liner so that the thickness after drying got to 15 μm, and then laminated on the surface of the temporary-adhesive layer exposed by peeling the peeling liner of the radiation curable surface protective tape, whereby a 155 μm-thick radiation curable mask-integrated surface protective tape 3 was obtained.

<Production of Semiconductor Chip>

The above-obtained radiation curable mask-integrated surface protective tape was laminated on the surface of a silicon wafer (diameter: 8 inches) having thereon scribe lines using a laminator DR8500III (trade name, manufactured by Nitto Seiki Co., Ltd.).

After that, the surface (wafer backing-face) opposite to the surface on which the above-described mask-integrated surface protective tape was laminated, was ground using DGP8760 (trade name, manufactured by DISCO Corporation) until a thickness of the wafer got to 50 μm. The ground wafer with the mask material was mounted on a wafer fixing tape (radiation curable dicing tape) from the wafer backing-face side using RAD-2700F (trade name, manufactured by Lintec Corporation), and was supported and fixed to a ring flame. Further, only the surface protective tape 3a was peeled while leaving only the mask material layer 3b on the wafer. After that, similarly to Example 1, an opening was formed on the scribe line and then the plasma dicing and the ashing were carried out, and after ultraviolet irradiation, chips were picked up.

In the above-described Example 2, the 25 mm-width mask-integrated surface protective tape was laminated on stainless steel as a model semiconductor wafer, as shown in the fragmentary FIG. 7(a). After that, an adhesive force was measured at a peeling angle of 180° and a peeling rate of 300 mm/min. As a result, as shown in the fragmentary FIG. 7(b), in 2.0 N/25 mm, peeling between the mask material layer and the temporary-adhesive layer was confirmed.

After the above-described evaluation, the temporary-adhesive layer was laminated again on the mask material layer exposed on the wafer, as shown in fragmentary FIG. 7(c), and the temporary-adhesive layer was irradiated with ultraviolet radiation (500 mJ/cm$^2$). The adhesive force was measured at a peeling angle of 180° and a peeling rate of 300 mm/min. As shown in fragmentary FIG. 7(d), repeeling between the mask material layer and the stainless steel was confirmed at an adhesive force of 0.4 N/25 mm. In order to check the reproducibility of this repeeling test, the repeeling test was performed ten times, and repeeling was confirmed in nine times. Therefore, in Table 1, repeelability of the mask material layer is "o".

[Example 3] Production of Mask-Integrated Surface Protective Tape, and Production of Semiconductor Chip <Production of Mask-Integrated Surface Protective Tape>

Were mixed 1.0 mol % of methacrylic acid, 23 mol % of butyl acrylate, 68 mol % of lauryl acrylate and 9.0 mol % of 2-hydroxyethyl acrylate. The mixture was subjected to a solution polymerization to obtain a solution of (meth)acrylic copolymer having a mass-average molecular weight of 650,000, an acid value of 5.0 mgKOH/g and Tg of –10° C.

To 100 mass parts of this obtained (meth)acrylic copolymer, 100 mass parts of 5-valent urethane acrylate oligomer having mass-average molecular weight of 1,500 (manufactured by Shin Nakamura Chemical Co., Ltd.) and 50 mass parts of 3-valent urethane acrylate oligomer (manufactured by Shin Nakamura Chemical Co., Ltd.) as ultraviolet-sensitive resins, 2.0 mass parts of Tetrad C (trade name, manufactured by MITSUBISHI GAS CHEMICAL COMPANY, INC.; 1,3-bis(N,N-diglycidylaminomethyl)cyclohexane) as a curing agent, and 10 mass parts of IRGACURE 184 (manufactured by BASF) as a photopolymerization initiator were blended to obtain a temporary-adhesive composition D.

The temporary-adhesive composition D described above was applied on a peeling liner, and the temporary-adhesive layer thus formed was laminated on a laminate film of a PET (polyethylene terephthalate) having a thickness of 100 μm and LDPE (low-density polyethylene) (layer configuration 25 μm: 75 μm), the temporary-adhesive layer being laminated on the LDPE layer, and thus a 105 μm-thickness radiation-curable surface protective tape 3a was obtained.

The curing agent for the temporary-adhesive composition B of Example 1 described above was changed to Tetrad C [trade name: manufactured by MITSUBISHI GAS CHEMICAL COMPANY, INC.; 1,3-bis(N,N-diglycidylaminomethyl)cyclohexanone], and subsequently a temporary-adhesive composition E produced similarly was obtained.

Further, the temporary-adhesive composition E was coated as a composition for forming the mask material layer on a peeling liner so that the thickness after drying got to 5 μm, and then laminated on the surface of the temporary-adhesive layer exposed by peeling the peeling liner of the radiation curable surface protective tape, whereby a 110 μm-thick radiation curable mask-integrated surface protective tape 3 was obtained.

<Production of Semiconductor Chip>

The above-obtained radiation curable mask-integrated surface protective tape was laminated on the surface of a silicon wafer (diameter: 8 inches) having thereon scribe lines using a laminator DR8500III (trade name, manufactured by Nitto Seiki Co., Ltd.).

After that, the surface (wafer backing-face) opposite to the surface on which the above-described mask-integrated surface protective tape was laminated, was ground using DGP8760 (trade name, manufactured by DISCO Corporation) until a thickness of the wafer got to 50 μm. The ground wafer was mounted on a wafer fixing tape (radiation curable dicing tape) from the wafer backing-face side using RAD-2700F (trade name, manufactured by Lintec Corporation), and was supported and fixed to a ring flame. Further, only the surface protective tape 3a was peeled while leaving only the mask material layer 3b on the wafer. Herein, from the results that only the surface protective tape 3a was peeled while leaving the mask material layer 3b, it was found that, before the ultraviolet irradiation, the adhesive force between the mask material layer and the temporary-adhesive layer was lower than the adhesive force between the mask material layer and the wafer.

After that, similarly to Example 1, an opening was formed on the scribe line and then the plasma dicing and the ashing were carried out, and after ultraviolet irradiation, chips were picked up.

In the above-described Example 3, the 25 mm-width mask-integrated surface protective tape was laminated on stainless steel as a model semiconductor wafer, as shown in the fragmentary FIG. 7(a). After that, an adhesive force was measured at a peeling angle of 180° and a peeling rate of 300 mm/min. As a result, as shown in the fragmentary FIG. 7(b), in 1.9 N/25 mm, peeling between the mask material layer and the temporary-adhesive layer was confirmed.

After the above-described evaluation, the temporary-adhesive layer was laminated again on the mask material exposed on the wafer, and the temporary-adhesive layer was irradiated with ultraviolet radiation (500 mJ/cm$^2$). The adhesive force was measured at a peeling angle of 180° and a peeling rate of 300 mm/min. As shown in fragmentary FIG. 7(d), repeeling between the mask material layer and stainless steel was confirmed at an adhesive force of 1.3 N/25 mm. In order to check the reproducibility of this repeeling test, the repeeling test was performed ten times, and repeeling was confirmed in nine times. Therefore, in Table 1, repeelability of the mask material layer is "o".

[Comparative Example 1] Production of Mask-Integrated Surface Protective Tape, and Production of Semiconductor Chip <Production of Mask-Integrated Surface Protective Tape>

Were mixed 1.0 mol % of methacrylic acid, 35.0 mol % of methyl methacrylate, 60 mol % of 2-ethylhexyl acrylate and 2.0 mol % of 2-hydroxyethyl acrylate. The mixture was subjected to a solution polymerization to obtain a solution of (meth)acrylic copolymer having a mass-average molecular weight of 200,000, an acid value of 6.0 mgKOH/g and Tg of −30° C.

To 100 mass parts of this obtained (meth)acrylic copolymer, 2.0 mass parts of an epoxy-series curing agent was blended to obtain a temporary-adhesive F.

Herein, N,N,N',N'-tetraglycidyl-1,3-benzenedi(methanamine) (manufactured by MITSUBISHI GAS CHEMICAL COMPANY, INC., trade name: TETRAD-X) was used as the epoxy-series curing agent.

The temporary-adhesive composition F described above was applied on a peeling liner, and the temporary-adhesive layer thus formed was laminated on a laminate film of a PET (polyethylene terephthalate) having a thickness of 100 μm and LDPE (low-density polyethylene) (layer configuration 25 μm: 75 μm), the temporary-adhesive layer being laminated on the LDPE layer, and thus a 130 μm-thick pressure-sensitive surface protective tape 3a was obtained.

Further, the temporary-adhesive composition B prepared in Example 1 was coated as a composition for forming the mask material layer on a peeling liner so that the thickness after drying got to 5 μm, and then laminated on the surface of the temporary-adhesive layer exposed by peeling the peeling liner of the pressure-sensitive surface protective tape, whereby a 135 μm-thick radiation curable mask-integrated surface protective tape 3 was obtained.

<Production of Semiconductor Chip>

The above-obtained mask-integrated surface protective tape was laminated on the surface of a silicon wafer (diameter: 8 inches) having thereon scribe lines using a laminator DR8500III (trade name, manufactured by Nitto Seiki Co., Ltd.).

After that, the surface (wafer backing-face) opposite to the surface on which the above-described mask-integrated surface protective tape was laminated, was ground using DGP8760 (trade name, manufactured by DISCO Corporation) until a thickness of the wafer got to 50 μm. The ground wafer was mounted on a wafer fixing tape (radiation curable dicing tape) from the wafer backing-face side using RAD-2700F (trade name, manufactured by Lintec Corporation), and was supported and fixed to a ring flame. Furthermore, it was attempted to peel the surface protective tape 3a only and to leave the mask material layer 3b only on the wafer. However, peeling of the surface protective tape 3a only while leaving the mask material layer 3b did not occur. From this result, it was found that the adhesive force between the mask material layer and the temporary-adhesive layer before irradiation with radiation was larger than the adhesive force between the mask material layer and the wafer.

In addition, since the surface protective tape was not peeled to leave only the mask material, repeelability of the mask material layer, removability of the mask material layer of Test Example 3 described below, and the adhesive deposit on the scribe lines of Test Example 3 could not be evaluated.

[Comparative Example 2] Production of Mask-Integrated Surface Protective Tape, and Production of Semiconductor Chip <Production of Mask-Integrated Surface Protective Tape>

The temporary-adhesive composition F prepared in Comparative Example 3 was applied on a peeling liner, and the temporary-adhesive layer thus formed was laminated on a laminate film of a PET (polyethylene terephthalate) having a thickness of 100 μm and LDPE (low-density polyethylene) (layer configuration 25 μm: 75 μm), the temporary-adhesive layer being laminated on the LDPE layer, and thus a 130 µm-thick pressure-sensitive surface protective tape 3a was obtained.

Further, the temporary-adhesive composition F was coated as a composition for forming the mask material layer on a peeling liner so that the thickness after drying got to 10 µm, and then was laminated on the surface of the temporary-adhesive layer exposed by peeling the peeling liner of the above-described pressure-sensitive surface protective tape, whereby a pressure-sensitive mask-integrated surface protective tape 3 having a total thickness of 140 µm was obtained.

<Production of Semiconductor Chip>

The above-obtained mask-integrated surface protective tape was laminated on the surface of a silicon wafer (diameter: 8 inches) having thereon scribe lines using a laminator DR8500III (trade name, manufactured by Nitto Seiki Co., Ltd.).

After that, the surface (wafer backing-face) opposite to the surface on which the above-described mask-integrated surface protective tape was laminated, was ground using DGP8760 (trade name, manufactured by DISCO Corporation) until a thickness of the wafer got to 50 µm. The ground wafer was mounted on a wafer fixing tape (radiation curable dicing tape) from the wafer backing-face side using RAD-2700F (trade name, manufactured by Lintec Corporation), and was supported and fixed to a ring flame. Furthermore, it was attempted to peel the surface protective tape 3a only and to leave the mask material layer 3b only on the wafer. However, peeling of the surface protective tape 3a only while leaving the mask material layer 3b did not occur. From this result, it was found that, before the ultraviolet irradiation, the adhesive force between the mask material layer and the temporary-adhesive layer was larger than the adhesive force between the mask material layer and the wafer.

In addition, since the surface protective tape was not peeled to leave only the mask material, repeelability of the mask material layer, removability of the mask material layer of Test Example 3 described below, and the adhesive deposit on the scribe lines of Test Example 3 could not be evaluated.

[Test Example 1] Evaluation of Adhesiveness Between Mask Material Layer and Temporary-Adhesive Layer Three test specimens each having width 25 mm×length 300 mm were taken from the mask-integrated surface protective as prepared in Examples and Comparative Examples. A 2-kg rubber roller was applied to each specimen in reciprocation of three times, to compress the test specimen onto a SUS sheet (model semiconductor wafer) finished with a No. 280 waterproof abrasive paper, as specified in JIS R 6253, with a thickness of 2.0 mm, as specified in JIS G 4305. The resultant specimen was left to stand for 1 hour, and then a temporary adhesive force at 23° C. was measured using a tensile tester, in accordance with JIS B7721, in which a measured value was within the range of 15 to 85% of the capacity thereof. Measurement was carried out by a 180-degree peel method, in which a tensile speed at that time was 300 mm/min.

[Test Example 2] Peeling Property Evaluation of Surface Protective Tape

In the <Production of semiconductor chip> in each of the above-described Examples and Comparative Examples, a force (peeling property) required for peeling the surface protective tape was evaluated in accordance with the following criterion. The peeling of the surface protective tape was carried out using RAD-2700F (trade name, manufactured by Lintec Corporation).

—Criterion for Evaluation of Peeling Property of the Surface Protective Tape—

⊙: Only the surface protective tape could be simply peeled with a weak force.

○: A strongish force was required for peeling, but only the surface protective tape could be peeled.

x: The surface protective tape could not be peeled. Alternatively, the surface protective tape was peeled together with the mask material layer.

[Test Example 3] Removal Property Evaluation of the Mask Material Layer by $O_2$ Plasma Ashing In the <Production of semiconductor chip> in each of the above-described Examples, the presence or absence of a residual of the mask material after $O_2$ plasma ashing (ashing for 10 minutes at the etching rate of 1.5 µm/min) was checked using a laser microscope.

—Criterion for Removal Property Evaluation of the Mask Material Layer—

○: A residue of the mask material layer was non-existent.

x: A residue of the mask material layer was existent.

[Test Example 4] Evaluation of Adhesive Deposit on the Scribe Line

In the <Production of semiconductor chip> in each of the above-described Examples, a wafer surface after peeling of the surface protective tape was observed by a microscope to determine the presence or absence of an adhesive deposit on the scribe line.

Evaluation Criteria of Adhesive Deposit on the Scribe Line—

○: An adhesive deposit was non-existent.

x: An adhesive deposit was existent.

The results of the Test Examples 1 to 3 are shown in Table 1.

Meanwhile, the symbol "-" represents that evaluation was not achieved.

TABLE 1

|  |  | Ex 1 | Ex 2 | Ex 3 | CEx 1 | CEx 2 |
|---|---|---|---|---|---|---|
| Tg [° C.] | Temporary-adhesive layer | −15 | −23 | −15 | −30 | −30 |
|  | Mask material layer | −23 | −10 | −23 | −23 | −30 |
| Acid value [mgKOH/g] | Temporary-adhesive layer | 0 | 9.8 | 5 | 12 | 6 |
|  | Mask material layer | 9.8 | 11 | 9.8 | 9.8 | 6 |

TABLE 1-continued

| | | Ex 1 | Ex 2 | Ex 3 | CEx 1 | CEx 2 |
|---|---|---|---|---|---|---|
| Adhesiveness between temporary-adhesive layer and mask material layer [N/25 mm] | Before UV irradiation | 1.2 | 2.0 | 1.9 | 2.3 | 3.2 |
| Peeling property of surface protective tape | | ⊙ | ○ | ○ | X | X |
| Removal property of mask material layer | | ○ | ○ | ○ | — | — |
| Adhesive deposit on scribe line | | ○ | ○ | ○ | — | — |
| Removability of mask material layer | | ⊙ | ○ | ○ | — | — |

Remarks:
'Ex' means Example according to this invention, and
'CEx' means Comparative Example.

From the results of each of the above-described Test Examples, it was found that, by using the mask-integrated surface protective tape of the present invention in the production of the semiconductor chip with a processing of the semiconductor wafer, a mask can be simply formed without an adhesive deposit only by laminating the mask-integrated surface protective tape on a patterned surface of the semiconductor wafer and then peeling the surface protective tape from this laminated mask-integrated surface protective tape, and further the mask can be removed with more certainty by an O₂ plasma, whereby occurrence of defective chips can be highly suppressed. Furthermore, it was found that when the temporary-adhesive layer is laminated again on the mask material layer and is irradiated with ultraviolet radiation, the mask material layer can be easily peeled off from the patterned surface.

Having described our invention as related to the present embodiments, it is our intention that the invention not be limited by any of the details of the description, unless otherwise specified, but rather be construed broadly within its spirit and scope as set out in the accompanying claims.

REFERENCE SIGNS LIST

1 Semiconductor wafer
2 Patterned face
3 Mask-integrated surface protective tape
3a Surface protective tape
3aa Substrate film
3ab Radiation-curable temporary-adhesive layer
3b Radiation-curable mask material layer
4 Wafer fixing tape
4a Temporary-adhesive layer or Adhesive layer
4b Substrate film
7 Chip
S Surface
B Backing-face
M1 Wafer-grinding apparatus
M2 Pin
M3 Collet
F Ring flame
L Laser (CO₂ laser)
P1 Plasma of SF₆ gas
P2 Plasma of O₂ gas

The invention claimed is:

1. A mask-integrated surface protective tape, comprising:
a substrate film;
a radiation-curable temporary-adhesive layer; and
a radiation-curable mask material layer;
wherein the radiation-curable temporary-adhesive layer and the radiation-curable mask material layer are provided on the substrate film in this order;
wherein, peeling occurs between the temporary-adhesive layer and the mask material layer before irradiation with radiation, and peeling occurs between the mask material layer and a patterned surface of a semiconductor wafer after irradiation with radiation;
wherein the mask material layer and the temporary-adhesive layer each contain a (meth)acrylic copolymer, and a radiation-polymerizable compound having a mass average molecular weight in a range of 2,000 to 20,000 and having a bifunctional, trifunctional, or higher-functional radiation-polymerizable functional group;
wherein glass transition temperatures (Tg) of the (meth) acrylic copolymer contained in the mask material layer and the (meth)acrylic copolymer contained in the temporary-adhesive layer each are −25° C. to −5° C.:
wherein an acid value of at least one of the (meth)acrylic copolymer contained in the mask material layer and the (meth)acrylic copolymer contained in the temporary-adhesive layer is 0 to 10 mgKOH/g;
wherein an absolute value of a difference between the glass transition temperature (Tg) of the (meth)acrylic copolymer for forming the temporary-adhesive layer and the glass transition temperature (Tg) of the (meth)acrylic copolymer for forming the mask material layer is 8° C. to 20° C.; and
wherein an absolute value of a difference between the acid value of the (meth)acrylic copolymer for forming the temporary-adhesive layer and the acid value of the (meth)acrylic copolymer for forming the mask material layer is 1.0 to 10 mgKOH/g.

2. The mask-integrated surface protective tape according to claim 1, wherein an adhesive force between the mask material layer and the temporary-adhesive layer before curing by irradiation with radiation is 2.0 N/25 mm or less.

3. The mask-integrated surface protective tape according to claim 1, wherein curing agents are used in the mask material layer and the temporary-adhesive layer, and wherein said curing agents used in the mask material layer and the temporary-adhesive layer each are an isocyanate-series curing agent.

4. The mask-integrated surface protective tape according to claim 1, wherein curing agents are used in the mask material layer and the temporary-adhesive layer, and wherein said curing agents used in the mask material layer and the temporary-adhesive layer each are an epoxy-series curing agent.

* * * * *